United States Patent
Talaga, Jr.

[11] Patent Number: 5,942,921
[45] Date of Patent: Aug. 24, 1999

[54] DIFFERENTIAL COMPARATOR WITH AN EXTENDED INPUT RANGE

[75] Inventor: Ronald F. Talaga, Jr., Austin, Tex.

[73] Assignee: Advanced Micro Devices, Inc., Sunnyvale, Calif.

[21] Appl. No.: 08/994,144

[22] Filed: Dec. 19, 1997

[51] Int. Cl.$^6$ ....................................................... H03K 5/22
[52] U.S. Cl. ............................. 327/77; 327/65; 327/89; 326/115
[58] Field of Search ................................. 327/333, 65, 77, 327/88, 89, 560–563; 326/80, 81, 83, 115; 330/252, 253

[56] References Cited

U.S. PATENT DOCUMENTS

| | | | |
|---|---|---|---|
| 4,295,063 | 10/1981 | Price, Jr. ..................................... | 327/77 |
| 5,083,046 | 1/1992 | Nagasawa ................................. | 326/115 |
| 5,530,444 | 6/1996 | Tice et al. ................................. | 330/252 |
| 5,541,538 | 7/1996 | Bacrania et al. ........................... | 327/77 |

*Primary Examiner*—Toan Tran
*Attorney, Agent, or Firm*—Conley, Rose & Tayon, PC; B. Noel Kivlin

[57] ABSTRACT

A differential comparator is provided with an extended input range. In one embodiment, a differential amplifier is provided with a differential input buffer that allows for differential detection even with input voltage signal levels that extend two or more volts beyond the power supply voltage. A first transistor coupled in series with a first resistor are coupled in parallel with a second transistor and a second series resistor. The transistor drain terminals are both coupled to the power supply voltage, and a current source draws current from the common node of the resistors. Input voltages are supplied to the gates of the transistors, and the differential output voltages are provided from the transistor source terminals. A differential amplifier receives the differential output voltages and provides a single output voltage.

10 Claims, 2 Drawing Sheets

DIFFERENTIAL COMPARATOR WITH AN EXTENDED INPUT RANGE

BACKGROUND OF THE INVENTION

1. Field of the Invention

This invention relates to methods for interfacing low voltage circuitry to high voltage circuitry, and in particular, to an interface circuit which operates from the low voltage power supply to detect differential signals which may have signal voltages that exceed the voltage of the low power supply.

2. Description of the Related Art

To reduce power consumption and to allow for increased integrated circuit densities, power supply voltages are being reduced. However, the voltage migration is not occurring simultaneously in all system components. Building a system using digital components powered by different supply voltages causes numerous interfacing problems. For example, transistors in the reduced voltage circuit may be subject to failure if forced to sustain the larger power supply voltage. Protecting these transistors with limiting diodes may prevent the transistors from detecting the desired signals, particularly in the case of differential signaling.

FIG. 1 shows a schematic of a differential amplifier. A current source 102 draws a current from two transistors 104 and 106 which are in parallel. Each transistor has a corresponding resistance 108 and 110 connected between the drain and the supply voltage. The current and the resistances are chosen so that whichever transistor receives the larger gate voltage carries most of the current and the corresponding resistor sustains a voltage drop nearly equal to that of the supply voltage. Hence, if the input voltage VIN is larger than the reference voltage VREF, transistor 106 conducts most of the current drawn by current source 102, and the output voltage VOUT is close to ground. If VIN is supplied from, say, a 2.5V circuit, and transistor 106 is designed using a 1.5V process, then the 2.5V drop between the gate and the drain will cause transistor failure.

An exemplary implementation of current source 102 is shown. Current passing through resistance 112 and transistor 114 self-biases transistor 114. As circuit conditions vary, the temperature coefficient of transistor 114 causes more or less current to be drawn, but this is compensated by the change in gate voltage that results. This provides an accurate bias to transistor 118 with resistance 116 to draw the desired current from transistors 104 and 106. Other current source and current mirror implementations are well known and may be used.

FIG. 2 shows a schematic of a differential amplifier 202 with protected inputs. Differential transistors 104 and 106 receive their input voltages via protection transistors 204 and 206 which have their gates tied to the supply voltage. Input voltages up to the supply voltage VCC minus the threshold voltage VTH are passed to the differential transistors, while voltages higher than that are blocked. Unfortunately, this circuit loses its differential behavior once the reference voltage exceeds VCC-VTH. For an exemplary power supply voltage of 1.5V, a reference voltage of 1.25 V (provided by a 2.5V circuit), would exceed the 1.0V maximum signal level that could be detected. The differential amplifier 202 is then unable to detect a high logic level at VIN.

A better method for interfacing a reduced voltage circuit to a circuit providing higher voltage signals is therefore desirable. The interface would provide for continued differential signal detection at voltage levels exceeding the reduced power supply voltage without requiring that a higher power supply voltage be provided.

SUMMARY OF THE INVENTION

The problems outlined above are in large part solved by a differential comparator with an extended input range. In one embodiment, a differential amplifier is provided with a differential input buffer that allows for differential detection even with input voltage signal levels that extend two or more volts beyond the power supply voltage. A first transistor and a first resistor coupled in series are coupled in parallel with a second transistor and a second series resistor. The transistor drain terminals are both coupled to the power supply voltage, and a current source draws current from the common node of the resistors. Input voltages are supplied to the gates of the transistors, and the differential output voltages are provided from the transistor source terminals. A differential amplifier receives the differential output voltages and provides a single output voltage.

Advantageously, the differential buffer transistors are exposed to only the differences between the input voltages and the power supply voltage, and consequently may not be subject to failure if the input voltage exceeds the power supply voltage. Further, the current carrying capacity of the transistors is modulated by the input voltages regardless of whether the input voltages exceed the supply voltages or not, thereby allowing differential detection even with signal voltages that exceed the power supply voltage. The differential buffer provides symmetric voltage swings (and for more than a few millivolts, uniform voltage swings) at the input to the differential amplifier, thereby avoiding variable propagation delay issues. These advantages may be provided while only incurring the cost of only a small number of additional components.

BRIEF DESCRIPTION OF THE DRAWINGS

Other objects and advantages of the invention will become apparent upon reading the following detailed description and upon reference to the accompanying drawings in which.

Figure 1:
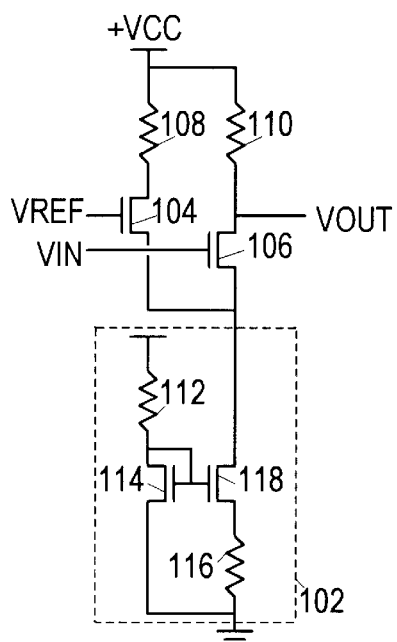
FIG. 1 is a schematic of a differential amplifier.
Figure 2:
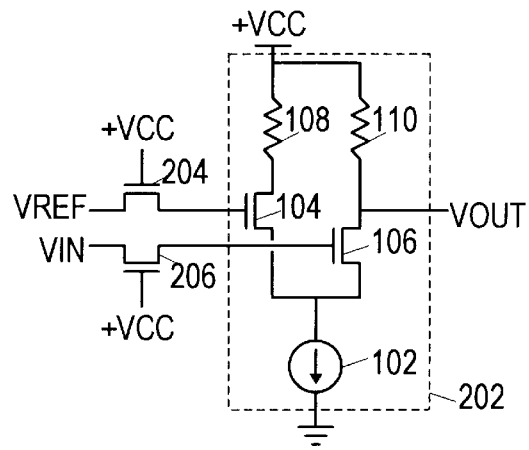
FIG. 2 is a schematic of a differential amplifier with protected inputs.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
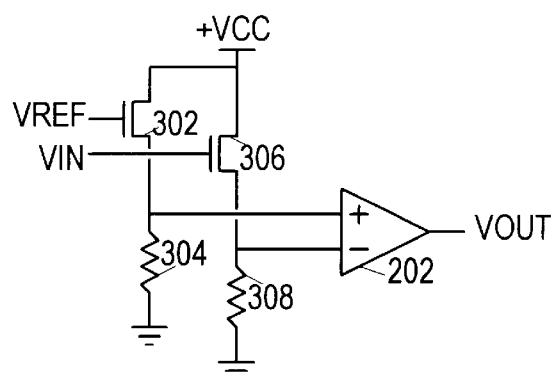
FIG. 3 is a schematic of a differential amplifier with buffered inputs.

FIG. 3 shows a schematic of a differential amplifier 202 with protected inputs. Transistor 302 is coupled in series between the power supply and a resistance 304, and resistance 304 is further coupled to ground. An input voltage is provided to the gate of transistor 302, and the ungrounded terminal of resistance 304 is provided as an input to differential amplifier 202. This configuration is commonly referred to as a "source follower" configuration. A second transistor 306 and a second resistor 308 are also set up in a source follower configuration for the second input to the differential amplifier 202. The voltage gain of a source follower is slightly less than 1, with a maximum output voltage of approximately $V_{CC}$, so the differential amplifier inputs are protected from input voltages which exceed the power supply voltage.

The source follower transistors 302 and 306 receive input voltages VREF and VIN, respectively. When the input voltages are low, the transistors block current. In this state, the transistors must sustain voltage differences up to the supply voltage, which they are designed to do. When the input voltages are high, the source follower transistors conduct. In this state, the voltage differences sustained by the transistors is the difference between the input voltage and the power supply voltage. Since the transistors are designed to sustain voltage differences at least equal to the power supply voltage, the input voltage may range up to at least twice the power supply voltage without causing transistor failure. In CMOS circuits, care should be taken to avoid driving the chip into SCR latchup, and this may require that a stricter limitation be placed on the input voltages.

In differential signaling, the input voltages may swing by unequal amounts. It is noted that the signal propagation delay in FIG. 3 is strongly influenced the voltage swing, due to the RC time constants caused by the differential amplifier input capacitances and resistors 304 and 308. As a result, the changes in input voltages may propagate to the output voltage at unequal speeds. Both the propagation delay and the shape of the output voltage transition are thereby affected by the input voltage swings. This sensitivity to the input voltage swing magnitude is highly undesirable.

Figure 4:
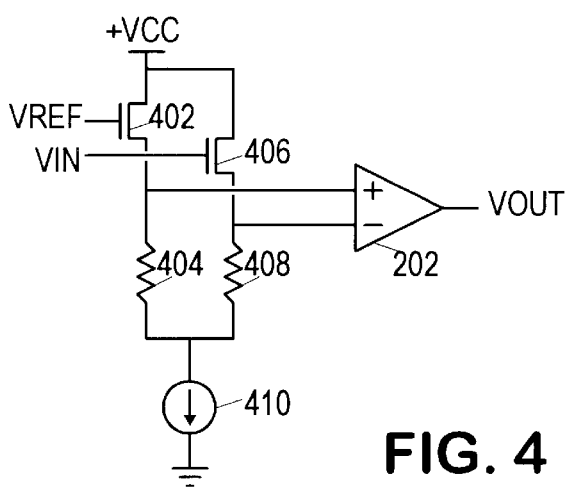
FIG. 4 is a schematic of a differential amplifier with a differential buffer.

Turning now to FIG. 4, a schematic of a differential buffer for a differential amplifier 202 is shown. The differential buffer includes a transistor 402 in series with a resistance 404, coupled in parallel with a second transistor 406 matched to the first (402) and a second resistance 408 equal to the first (404). The common node shared by the transistors 402 and 406 is coupled to the supply voltage, and the common node shared by the resistances 404 and 408 is connected to ground via a current source 410. The input voltages are provided to the gates of the transistors 402 and 406, and the output voltages are provided to the differential amplifier inputs from the transistor source terminals.

The differential buffer protects the differential amplifier from excess input signal voltages. The differential buffer transistors are can be driven by input voltage signals up to twice the power supply voltage, and the differential configuration of the buffer provides for continued differential signal detection at voltages above the power supply voltage. The current source 410 and the resistances 404 and 408 may be chosen so that as long as the difference between the input signal voltages is greater than a few millivolts, the output voltage difference saturates at approximately the power supply voltage. The uniform voltage swing at the input to the differential amplifier then provides for a fixed propagation delay, thereby eliminating sensitivity of the output voltage to the size of input voltage swings.

It is noted that the current source 410 may be approximated using a large resistance. All of the resistances may be provided in numerous well-known fashions, e.g. by a transistor with a grounded gate. For high frequency operation, the resistances may be replaced with complex impedances.

Figure 5:
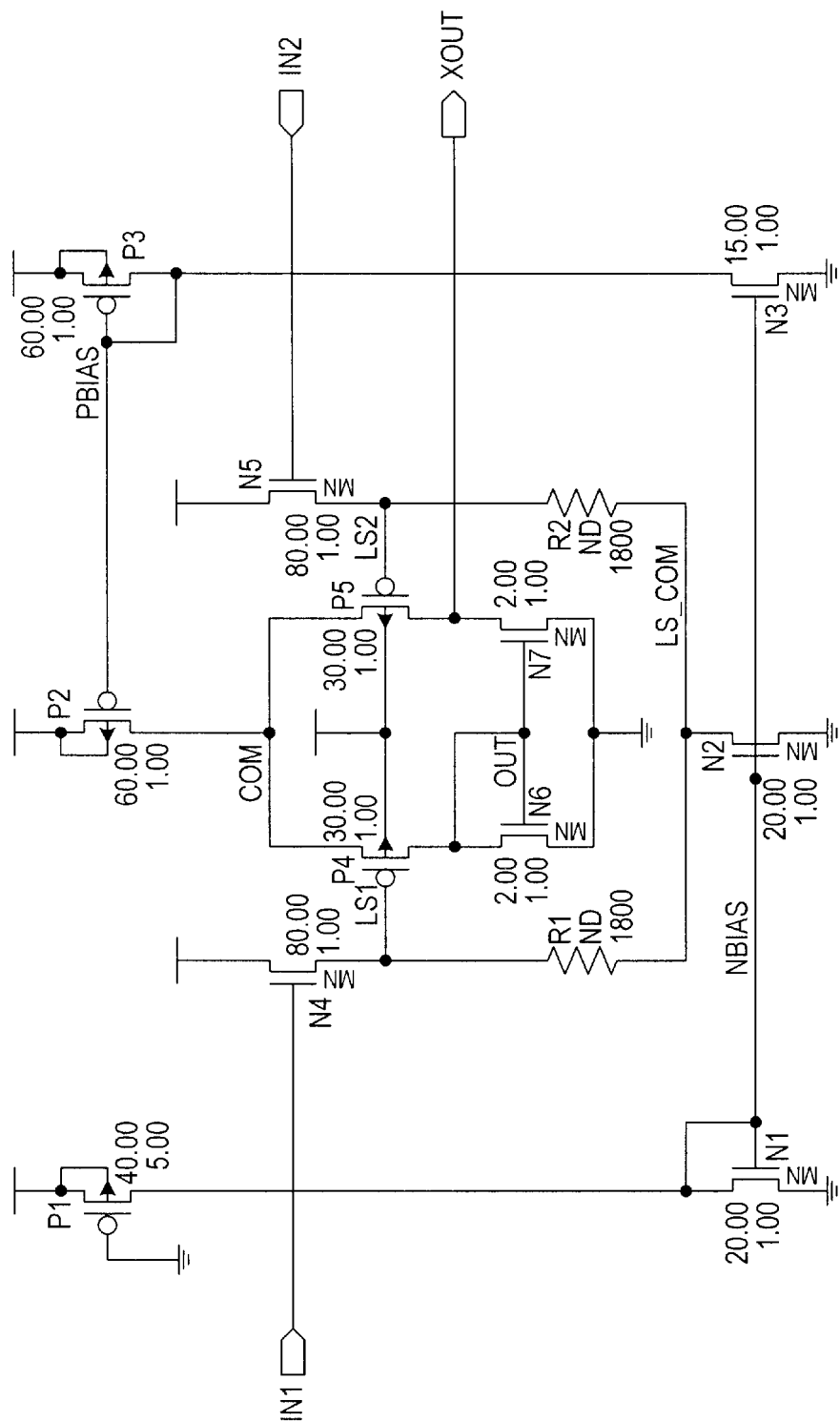
FIG. 5 is a transistor-level schematic of one embodiment of a differential amplifier having a differential buffer.

FIG. 5 shows a transistor-level schematic of one embodiment of the differential buffer and differential amplifier circuit of FIG. 4. Biasing transistors and current mirrors are shown for completeness, but it is noted that many biasing and current sourcing techniques exist and may be used.

Numerous variations and modifications will become apparent to those skilled in the art once the above disclosure is fully appreciated. For example, to provide for input voltage signals that may be less than the ground voltage, a differential buffer configuration using P transistors rather than N transistors may be used. It is intended that the following claims be interpreted to embrace all such variations and modifications.

What is claimed is:

1. A differential input buffer which comprises:
   a first transistor having a first terminal coupled to a first power supply voltage, a second terminal coupled to a first input of a differential amplifier, and a gate configured to receive a first input voltage signal;
   a second transistor matched to said first transistor, wherein the second transistor has a first terminal coupled to the power supply voltage, a second terminal coupled to a second input of the differential amplifier, and a gate configured to receive a second input voltage signal;
   a first impedance having a first terminal coupled to the second terminal of the first transistor;
   a second impedance coupled between the second terminal of the second transistor and a second terminal of the first impedance; and
   a high impedance coupled between the second terminal of the first impedance and a second power supply voltage.

2. The differential input buffer of claim 1, wherein the first impedance equals second impedance.

3. The differential input buffer of claim 1, wherein the high impedance is a current source.

4. The differential input buffer of claim 1, wherein the first and second impedances are resistors.

5. The differential input buffer of claim 1, wherein the first and second transistors are NMOS transistors, and wherein the first power supply voltage is positive relative to second power supply voltage.

6. An integrated circuit operating from a first power supply voltage and capable of receiving differential signals from a circuit module supplying a signal voltage which exceeds the first power supply voltage, wherein the integrated circuit comprises:
   a differential amplifier having an inverting input and a non-inverting input;
   a first transistor coupled between a power supply voltage and the non-inverting input, wherein the first transistor has a gate configured to receive a reference signal;
   a second transistor coupled between the power supply voltage and the inverting input, wherein the second transistor has a gate configured to receive an input signal;
   a third transistor configured as a high impedance current source;

a first resistor coupled between the non-inverting input and the third transistor; and a second resistor coupled between the inverting input and the third transistor.

7. The integrated circuit of claim 6, wherein the first and second transistors have matched characteristics, and wherein the first and second resistors have matched resistances.

8. The integrated circuit of claim 6, wherein the integrated circuit is a microprocessor and the circuit module is a bus interface unit of an external component operating at a second power supply voltage greater than the first power supply voltage.

9. The integrated circuit of claim 8, wherein the first power supply voltage is less than two volts and the second power supply voltage is greater than two volts.

10. A method for receiving differential signals having voltages which exceed a power supply voltage, wherein the method comprises:

receiving a reference signal at a gate of a first transistor having a power terminal coupled to a power supply voltage and a first output terminal;

receiving an input signal at a gate of a second transistor having a power terminal coupled to the power supply voltage and a second output terminal;

drawing a fixed combined current through the first and second transistors via respective first and second resistors respectively coupled to the first and second output terminals, thereby producing a differential output voltage at the first and second output terminals; and converting the differential output voltage into a digital signal indicative of when the input signal has a higher voltage than the reference signal.

\* \* \* \* \*